United States Patent [19]

Agonafer et al.

[11] Patent Number: 4,757,370
[45] Date of Patent: Jul. 12, 1988

[54] CIRCUIT PACKAGE COOLING TECHNIQUE WITH LIQUID FILM SPREADING DOWNWARD ACROSS PACKAGE SURFACE WITHOUT SEPARATION

[75] Inventors: Dereje Agonafer; Richard C. Chu; Robert E. Simons, all of Poughkeepsie, N.Y.

[73] Assignee: International Business Machines Corp., Armonk, N.Y.

[21] Appl. No.: 2,582

[22] Filed: Jan. 12, 1987

[51] Int. Cl.[4] .............................................. H01L 25/04
[52] U.S. Cl. ...................................... 357/82; 357/74; 357/75
[58] Field of Search ............................ 357/82, 74, 75

[56] References Cited

U.S. PATENT DOCUMENTS

| | | |
|---|---|---|
| 3,174,540 | 3/1965 | Dutton . |
| 3,586,101 | 6/1971 | Chu ..................... 357/82 |
| 3,972,063 | 7/1976 | Kimura et al. . |
| 3,980,133 | 9/1976 | Mitsuoka . |
| 3,986,550 | 10/1976 | Mitsuoka . |
| 4,019,098 | 4/1977 | McCready . |
| 4,027,728 | 6/1977 | Kobayashi et al. . |
| 4,145,708 | 3/1979 | Ferro et al. . |
| 4,151,548 | 4/1979 | Klein et al. . |
| 4,203,129 | 5/1980 | Oktay et al. ........................... 357/82 |
| 4,263,965 | 4/1981 | Mansuria et al. ..................... 357/82 |
| 4,312,012 | 1/1982 | Frieser et al. . |
| 4,335,781 | 6/1982 | Duffy . |
| 4,619,316 | 10/1986 | Nakayama et al. .................... 357/82 |

OTHER PUBLICATIONS

TDB, Jul. 1976, pp. 705–706, Sachar, "Integrated Circuit Cooling Device".
TDB, Dec. 1977, p. 2677, Hwang, "Heat Exchanger for Vapor Condensation by Dropwise Technique".
TDB, Nov. 1978, pp. 2439–2440, Keller et al., "High Power Rectifier Evaporative Heat Sink".
TDB, Jan. 1979, pp. 3281–3282, Moran et al., "Self-Regulating Evaporative/Conductive Thermal Link".
TDB, Mar. 1979, pp. 4020–4022, Hwang et al., "Evaporation Cooling Module".

Primary Examiner—Andrew J. James
Assistant Examiner—Gregory A. Key
Attorney, Agent, or Firm—W. S. Robertson

[57] ABSTRACT

Heat producing components such as semiconductor chips are arranged with a major heat transfer surface at an angle of about 10 degrees to the vertical. A film of a dielectric liquid flows downward across this surface from a catch pan located above the component. The film evaporates and thereby removes heat from the component and the vapor is condensed and returned to the catch pan. The angle of the heat transfer surface helps to prevent separation of the film as it flows downward across the surface. In one embodiment the slanting surface is formed by slanted grooves in an otherwise vertical surface of a semiconductor chip. In other embodiments, a slanting surface or a vertical surface with slanting grooves is formed in place on the chip or is formed separately and attached to the chip or is formed as part of a local enclosure for the chip.

3 Claims, 2 Drawing Sheets

CIRCUIT PACKAGE COOLING TECHNIQUE WITH LIQUID FILM SPREADING DOWNWARD ACROSS PACKAGE SURFACE WITHOUT SEPARATION

FIELD OF THE INVENTION

This invention relates to circuit packages of the type of which heat producing components are mounted on a circuit board in a planar array and are cooled by the evaporation of a film of a dielectric cooling liquid at the surface of the components.

INTRODUCTION

Circuit packages that can be adapted to use this invention are well known, but it will be helpful to review the terminology that applies to our invention. In some circuit packages, a semiconductor chip or other heat producing component is mounted on a thin flat supporting structure that is sometimes called a substrate or a circuit card or a circuit board, and will arbitrarily be called a card in our description. Semiconductor chips are mechanically and electrically connected to conductive areas called solder pads on one side of the card that will be called the front. the other major surface of the card will be called the back. (Some cards have components mounted on the back also.) A card is made of a dielectric material or is otherwise arranged to carry electrical wiring, and this wiring connects the solder pads to external contact points that are typically located along the bottom edge of the card.

The card can be inserted downward into an electrical socket that forms part of a structure for supporting the card in a vertical plane. Several cards are mounted on a common supporting structure with close front to back spacing between cards. Typically the common supporting structure includes a circuit board that carries wiring from card to card.

A semiconductor chip has a shape that is thin and square or rectangular. One major surface of the chip faces the card and can be called the inner surface of the chip. In some circuit packages, solder balls form the connections between the chip and the solder pads, and the inner surface is spaced only a short distance from the surface of the card. The outer major surface of the chip is exposed to a coolant, and heat from the module primarily flows across this surface. If one or more chips have a local enclosure, the local enclosure also typically has a thin and square or rectangular shape. A heat transfer device may be attached to the outer surface of the chip or formed in place on the outer surface. For example, two of us have proposed a fin structure that is attached to the back of the chip (Chu and Simons, application Ser. No. 921,902 for "Heat Transfer Element with Nucleate Boiling Surface and Bimetalic Fins Formed from Element" now U.S. Pat. 4,709,754, issued Dec. 1, 1987). For generality, the surface of the chip or a related structure in contact with a coolant wil be called the "heat transfer surface".

Our invention will be particularly useful for packaging memory chips. Memories commonly have several cards and these cards each carry a row and column array of identical chips. Memory chips commonly produce heat at a low rate and they are typically air cooled. Our invention provides added cooling for memory chips in a simple structure that avoids the complexity that is typical for high power logic circuits. A typical circuit package for logic circuits is disclosed in U.S. Pat. No. 3,993,123 to Chu, Gupta, Hwang and Simons.

THE PRIOR ART

One circuit package of this general type is described in "IBM Technical Disclosure Bulletin", March 1968, pages 1557–1558, "Wick-Evaporative Cooling System", by R. C. Chu. An enclosure holds several circuit boards that are arranged in closely spaced vertical planes in an enclosure. Heat producing components are mounted on the boards and the outer surfaces of the components are covered by a wick material. A dielectric liquid coolant is carried in the bottom of the enclosure and covers the lowest components and the associated part of the wick material. The coolant rises through the wick by capillary action so that all of the components that are not immersed in the liquid are covered by a liquid film. This film evaporates from the heat transfer surface of the components and thereby cools the components. A water cooled condenser is located at the top of the enclosure and vapor condenses and the liquid coolant falls from the condenser. Troughs are located along the top edge of each board to catch the liquid and distribute it to the wick material. Thus the coolant travels in a cycle of evaporation and condensation. Note that immersing the wick in the liquid starts the operation when the components are cold and there is no evaporation. It also makes up for liquid dripping from the condenser that is is not caught by a trough.

Another circuit package of this general type is described in "IBM Technical Disclosure Bulletin", December, 1985, pages 3205–3206, "Circuit Modules with Vertically Extending Grooves Providing Capillary Action for Distributing an Evaporating Dielectric Liquid", also by R. C. Chu. The heat producing components have small pans along their lower edges that catch the liquid from the condenser. Capillary action carries the liquid upward rises over the heat transfer surface of the components to form a film that evaporates.

SUMMARY OF THE INVENTION

Our circuit package uses the feature of the Chu 1985 publication that each component receives the coolant directly from the condenser, using a catch pan that is a modification of the catch pan taught in the publication. There is a limit (capillary pumping limitation), however, to the amount of liquid that can be delivered to the heat dissipating components which in turn limits the heat transport capability of the device. To overcome this limitation, we locate the catch pan above the chip. The liquid flows by gravity through holes in the catch pan and downward across the surface of the chip. The holes in the catch pan are configured to give a high flow rate for improved heat transfer. Initially, an auxiliary heater or a small pump can be used to provide liquid to the heated section.

There is a problem that the liquid film tends to separate from the back of the chip. As boiling occurs, bubbles from and rise through the film and escape at the film surface. As the film flows downward across the chip surface at a velocity that is high enough for good heat transfer, these bubbles are swept downstream with the liquid and they tend to accumulate near the surface of the chip. If enough bubbles accumulate, they can force the film to separate from the chip surface. Since the bubbles have much poorer heat transfer characteristics than the liquid, the chip can overheat where the film becomes separated.

In our circuit package, the heat transfer surface has a slight angle to the vertical. A component of the gravitational force is normal to the surface, which prolongs the onset of separation. We theorize that the component of the gravitational force that is normal to the chip surface can be sufficient to offset the force of the bubbles.

Preferably the slanting surface is established by a technique that permits the chip to be mounted on the card with its outer surface parallel to the front surface of the card, as is conventional. In one embodiment, the slanting surface is formed as the bottom of grooves in the surface of the chip. The grooves are deep at the top of the chip and shallow at the bottom of the chip. The lands between the grooves have the flat surface of the original chip. The grooves have the incidental advantage of increasing the heat transfer surface of the chip. The grooves can be formed in the surface of the semiconductor body of the chip, or a metal cap with these grooves can be attached to the chip or formed in place on the chip.

In a second embodiment, the heat transfer surface has surface projections in the shape of parallelograms that give the heat transfer surface a tire thread appearance and thereby increase the area of the heat transfer surface. In addition, this particular surface can be used to control the liquid film distribution on the heated surface. For non-uniform heat flux surfaces (varying power chips), more liquid can be guided into the areas of higher power or heat flux.

The preferred angle is around 10 degrees. Calculations have shown that an angle in this range has very little effect on heat transfer coefficients.

THE DRAWING

THE PREFERRED EMBODIMENT

Figure 1:
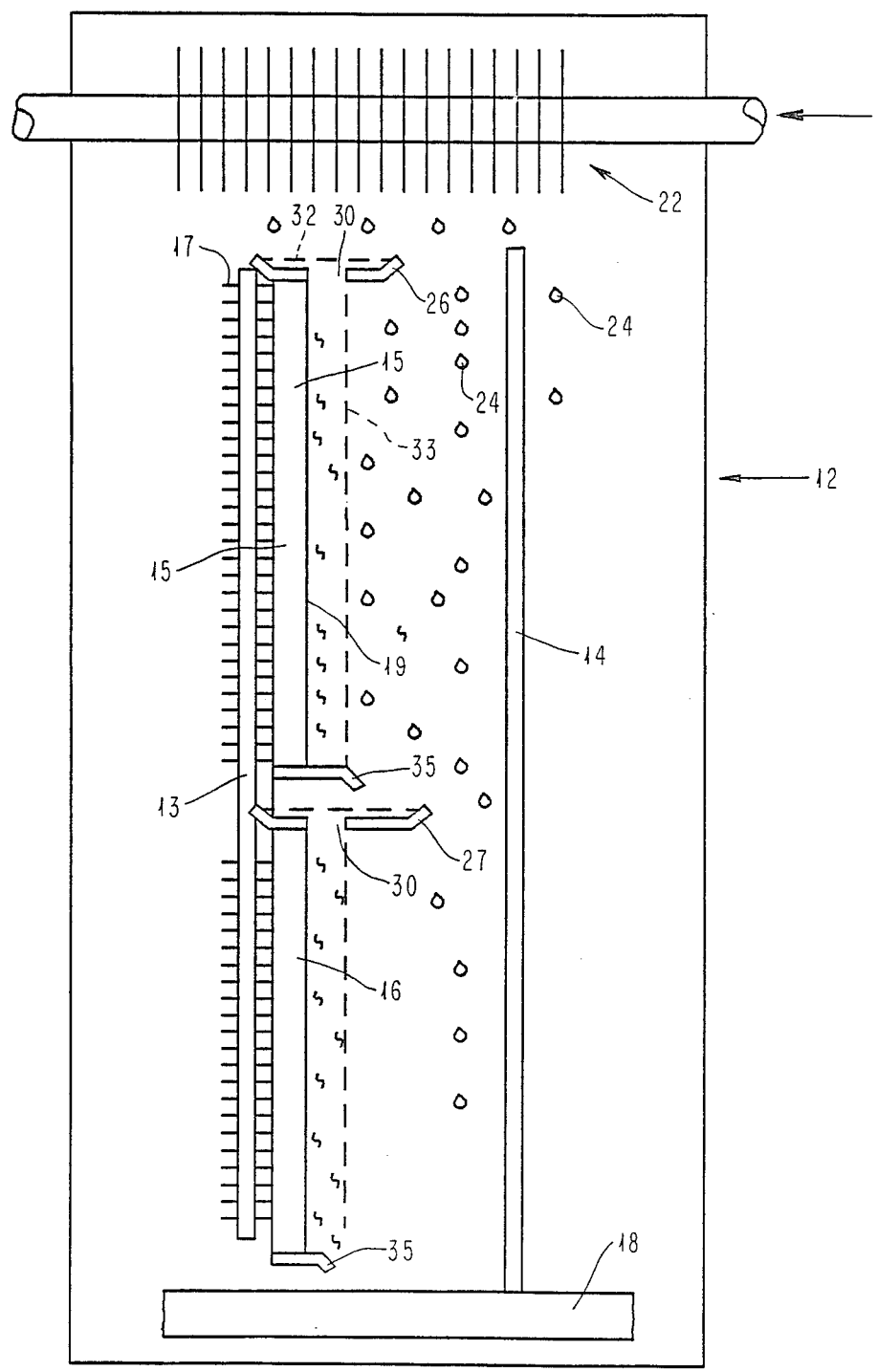
FIG. 1 is an edge view of a circuit package using the heat transfer surface of this invention.

Conventional Features—FIG. 1

FIG. 1 shows an enclosure 12 having conventional means for supporting representative circuit cards 13, 14 in closely spaced vertical planes. Each card carries components, including representative heat producing components 15, 16 such as semiconductor chips which are attached to a card by pins 17. (The rightmost card, 14, is shown only to illustrate the spacing between cards and its components are not shown.) The cards are mechanically and electrically connected to a circuit board 18. The schematic drawing for components 15, 16 represents either a chip or a local enclosure or package for a chip. Commonly, the components are rectangular as seen from the front of the card and they are arranged on the card in an approximate row and column array. The major outer surface 19 of a component will be called the heat transfer surface.

The bottom of the enclosure 12 forms a sump for a dielectric liquid. A heat exchanger 22 is located above the cards. Preferably the heat exchanger carries chilled water, but other suitable coolants can be used. The dielectric vapor condenses on the heat exchanger and falls from the heat exchanger as represented in the drawing by drops 24. The heat exchanger has a horizontally flattened shape to overlie the entire set of cards. Alternatively, the shape of the heat exchanger is independent of the area occupied by the cards and a system of baffles distributes the condensate to all of the cards.

FIG. 1—The Improved Structure

Catch pans 26, 27 are located along the upper edges of the heat producing components. The catch pans are terraced as taught in the Chu 1985 publication so that the lower catch pan 27 receives about the same amount of condensate as the upper catch pan 26. They have pores or slits 30 along the bottom edge so that the liquid falls from a catch pan onto the upper edge of the heat transfer surface 19. The liquid then flows by gravity across the heat transfer surface. Marks 31 schematically represent vapor formed in the film. As will be explained later, the flow is shaped into a film that is thin enough to promote boiling within a narrow temperature range. The ends of the catch pans are closed (not shown in the schematic representation of the drawing) and the liquid is held to a suitable level 32.

Dashed lines 33 represent the outer surface of the dielectric film. The opening 30 in a catch pan is made the appropriate size to establish a film of appropriate thickness. When only the vertical length of the component is considered, the initial film thickness (at the top of the component) must be greater for a longer component because the liquid evaporates as it flows down the heat transfer surface. For components of a given length, tests show a complex relationship between component power and the required film thickness, but we contemplate that the initial film thickness will be in the range of 0.25 mm to 3.0 mm for most heat producing components.

Liquid that does not fall into the upper catch pan 26 falls into a lower catch pan 27 or into the sump. A drip rail 35 is located at the bottom edge of the chip to help prevent the liquid from flowing up the inside surface of the chip by capillary action. (The effect is harmless except that make up is increased.)

As taught in the Chu publications, suitable means is provided for starting the cycle when the components are cold and for making up for the liquid coolant that falls into the sump. Preferably, a small pump (not shown in the drawing) circulates liquid from the sump to the top of the enclosure where it is distributed to the cards in the same pattern provided by the heat exchanger or the baffle system.

Figure 2:
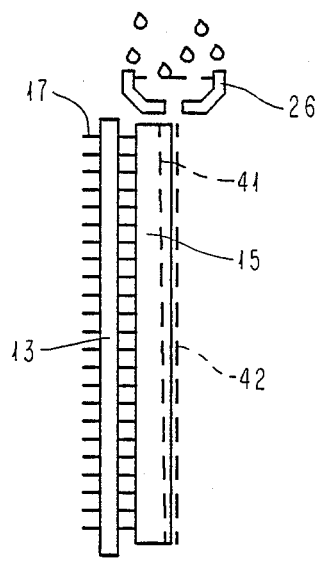
FIG. 2 is an edge view of a heat producing component having a slanting surface formed by grooves in the heat transfer surface.
Figure 3:
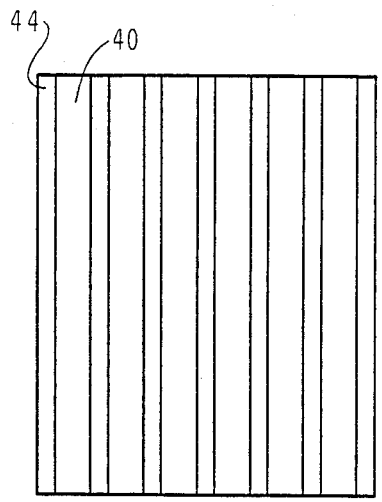
FIG. 3 is a front view of the structure of FIG. 2.

The Slanted Chip Surface—FIGS. 2 and 3

The heat transfer surface 19 has a slant at an angle of about 10 degrees. In the structure of FIGS. 2 and 3, slanted grooves 40 are cut into the back of the chip 15. Dashed line 41 in FIG. 2 represents the bottom of a groove and dashed line 42 represents the outer surface of the film. Techniques for forming the grooves are well known and include cutting the chip with a diamond saw. The grooves have the incidental advantage of increasing the surface area of the heat transfer surface.

Alternatively, the structure of FIG. 2 can be formed as a separate structure that is attached to the chip or is formed in place on the surface of the chip.

The width and the depth of the grooves are each about 10 to 50 mils (thousands of an inch). The width of the fins or lands 44 between the grooves is also about 10 to 50 mils. These dimensions are not necessarily the same, and FIG. 3 shows the grooves 40 wider than the lands 44.

Figure 4:
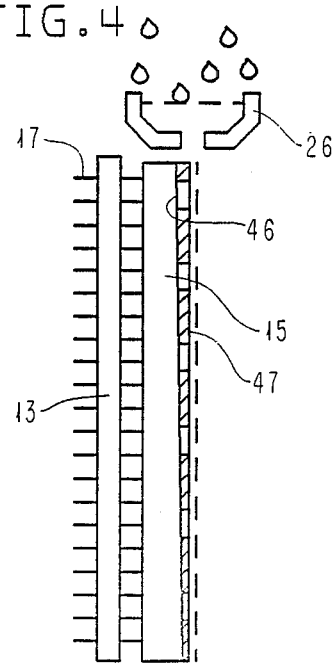
FIG. 4 is an edge view of a heat producing component having a slanting surface with a tire tread pattern of raised areas forming an extended surface.
Figure 5:
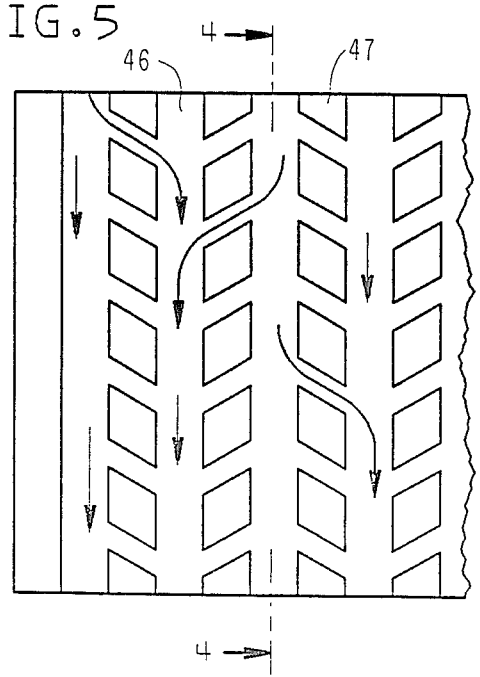
FIG. 5 is a front view of the structure of FIG. 4.

The Embodiment of FIGS. 4 and 5

FIGS. 4 and 5 show a slanting surface 46 that is formed separately and attached to the chip or is formed in place on the chip as described for the structure of FIGS. 3 and 4. Surface 46 has raised areas 47 that are in the shape of a parallelogram and are combined to form oppositely slanting rows in a tire tread shape. The height of raised areas 47 can be decreased from top to bottom so that the outermost surface is vertical.

Other Embodiments

Those skilled in the art will recognize applications of our invention to other circuit devices with the slanting heat transfer surface formed in various suitable configurations.

What we claim is:

1. A circuit package of the type in which a heat producing device such as a semiconductor chip is carried on a planar supporting structure such as a circuit card and has a generally flat heat transfer surface facing outward from the supporting structure and has a generally straight upper edge, the supporting structure being oriented in a generally vertical plane for normal operation, and a film of a dielectric cooling liquid is supplied to the surface and evaporates from the surface in a process in which vapor bubbles move through the film to the surface of the film and the device is thereby cooled, the improvement comprising, means for distributing the liquid coolant along an upper edge of the heat transfer surface to permit the liquid to flow downward by gravity across the heat transfer surface at a rate for good heat transfer, such that the vapor bubbles are swept downstream and thereby tend to form a thick bubble layer pushing the film away from the heat transfer surface, and means for locating said heat transfer surface at a slight angle to the vertical sufficient to prevent separation of the film from the heat transfer surface.

2. A circuit package comprising a plurality of generally planar circuit cards each having major surfaces designated front and back, an enclosure suitable for holding the cards, and means mounting the circuit cards in the enclosure front to back in generally vertical parallel planes spaced apart approximately equally, a plurality of heat producing electronic components such as semiconductor chips that each have a generally rectangular perimeter defining a generally flat surface for heat transfer and are mounted on each card in approximately a row and column array with one major surface facing the card and the other major surface facing away from the card, a liquid dielectric coolant in the enclosure having a boiling temperature that is suitably less than the outer surface temperature of a heat producing component in normal operation for evaporating a film of the dielectric cooling liquid formed on the outer surface and thereby cooling the component, a sump for the liquid at the bottom of the enclosure, and a heat exchanger at the top of the enclosure for condensing vapor produced by evaporation of the liquid coolant from the heat producing components, a plurality of catch pans located along the top edge of each chip to receive liquid condensed by the heat exchanger, and means in the catch pan for distributing the liquid across the uppe edge of the flat surface of the heat producing component, and means positioning the heat transfer surfaces of the heat producing components at an angle that is sufficient to offset the tendency of the liquid film to separate from the heat transfer surface.

3. The circuit package of claim 2 wherein said heat producing component comprises a semiconductor chip and a metal element in a heat conduction relationship to said chip and shaped to form said heat transfer surface at said angle.

* * * * *